(12) United States Patent
Lee et al.

(10) Patent No.: US 7,320,933 B2
(45) Date of Patent: Jan. 22, 2008

(54) DOUBLE BUMPING OF FLEXIBLE SUBSTRATE FOR FIRST AND SECOND LEVEL INTERCONNECTS

(75) Inventors: Teck Kheng Lee, Singapore (SG); Kian Chai Lee, Singapore (SG); Sian Yong Khoo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/829,778

(22) Filed: Apr. 22, 2004

(65) Prior Publication Data

US 2004/0198033 A1 Oct. 7, 2004

Related U.S. Application Data

(62) Division of application No. 10/225,085, filed on Aug. 20, 2002.

(51) Int. Cl.
*H01L 21/44* (2006.01)
(52) U.S. Cl. ............ 438/614; 438/108; 438/612; 438/613
(58) Field of Classification Search ........... 438/108, 438/112, 124, 127, 612–616; 257/734, 737, 257/738, 778, 780, 787
See application file for complete search history.

(56) References Cited

U.S. PATENT DOCUMENTS

| 3,239,496 | A |   | 3/1966  | Jursich |
| 4,074,342 | A |   | 2/1978  | Honn et al. |
| 4,807,021 | A |   | 2/1989  | Okumura |
| 4,818,728 | A |   | 4/1989  | Rai et al. |
| 4,954,875 | A |   | 9/1990  | Clements |
| 5,148,265 | A |   | 9/1992  | Khandros |
| 5,346,861 | A |   | 9/1994  | Khandros |
| 5,347,159 | A |   | 9/1994  | Khandros et al. |
| 5,366,794 | A |   | 11/1994 | Nakao |
| 5,385,869 | A |   | 1/1995  | Liu et al. |
| 5,386,341 | A |   | 1/1995  | Olson et al. |
| 5,388,327 | A | * | 2/1995  | Trabucco ............... 29/830 |

(Continued)

FOREIGN PATENT DOCUMENTS

EP      0475022 A1    3/1992

(Continued)

OTHER PUBLICATIONS

Australian Search Report dated Aug. 11, 2004 (3 pages).

(Continued)

*Primary Examiner*—Ori Nadav
(74) *Attorney, Agent, or Firm*—TraskBritt

(57) ABSTRACT

An apparatus and method for improving the yield and reducing the cost of forming a semiconductor device assembly. An interposer substrate is formed with interconnections in the form of conductive bumps on both a first surface and a second surface to provide a respective first level interconnect and a second level interconnect for a semiconductor die to be mounted to the interposer substrate. The conductive bumps and conductive elements may be formed simultaneously by a plating process. The conductive bumps on the first surface are arranged to correspond with bond pads of a semiconductor die for the first level interconnect. The conductive bumps on the second surface are configured to correspond with a terminal pad pattern of a carrier substrate or other higher-level packaging.

19 Claims, 7 Drawing Sheets

U.S. PATENT DOCUMENTS

| | | |
|---|---|---|
| 5,397,921 A | 3/1995 | Karnezos |
| 5,404,044 A | 4/1995 | Booth et al. |
| 5,409,865 A | 4/1995 | Karnezos |
| 5,422,205 A | 6/1995 | Inoue et al. |
| 5,434,452 A * | 7/1995 | Higgins, III ................. 257/773 |
| 5,438,477 A | 8/1995 | Pasch |
| 5,448,511 A | 9/1995 | Paurus et al. |
| 5,468,681 A | 11/1995 | Pasch |
| 5,468,995 A | 11/1995 | Higgins, III |
| 5,489,804 A | 2/1996 | Pasch |
| 5,504,277 A | 4/1996 | Danner |
| 5,598,033 A | 1/1997 | Behlen et al. |
| 5,608,265 A | 3/1997 | Kitano et al. |
| 5,646,446 A | 7/1997 | Nicewarner, Jr. et al. |
| 5,663,530 A | 9/1997 | Schueller et al. |
| 5,668,405 A | 9/1997 | Yamashita |
| 5,674,785 A | 10/1997 | Akram et al. |
| 5,679,977 A | 10/1997 | Khandros |
| 5,683,942 A | 11/1997 | Kata |
| 5,697,148 A | 12/1997 | Lance, Jr. et al. |
| 5,710,071 A | 1/1998 | Beddingfield et al. |
| 5,719,449 A | 2/1998 | Strauss |
| 5,721,151 A | 2/1998 | Padmanabhan et al. |
| 5,723,347 A | 3/1998 | Hirano et al. |
| 5,739,585 A | 4/1998 | Akram et al. |
| 5,742,100 A | 4/1998 | Schroeder et al. |
| 5,747,982 A | 5/1998 | Dromgoole et al. |
| 5,752,182 A | 5/1998 | Nakatsuka et al. |
| 5,758,413 A | 6/1998 | Chong et al. |
| 5,768,109 A | 6/1998 | Gulick et al. |
| 5,777,391 A | 7/1998 | Nakamura |
| 5,798,285 A | 8/1998 | Bentlage et al. |
| 5,798,567 A | 8/1998 | Kelly et al. |
| 5,805,422 A | 9/1998 | Otake et al. |
| 5,812,378 A | 9/1998 | Fjelstad et al. |
| 5,818,113 A | 10/1998 | Iseki et al. |
| 5,821,624 A | 10/1998 | Pasch |
| 5,834,338 A | 11/1998 | Takeda et al. |
| 5,834,366 A | 11/1998 | Akram |
| 5,834,848 A | 11/1998 | Iwasaki |
| 5,835,355 A | 11/1998 | Dordi |
| 5,843,808 A | 12/1998 | Karnezos |
| 5,844,168 A | 12/1998 | Schueller et al. |
| 5,844,315 A | 12/1998 | Melton et al. |
| 5,866,953 A | 2/1999 | Akram et al. |
| 5,877,559 A * | 3/1999 | Takayama et al. .......... 257/773 |
| 5,886,408 A | 3/1999 | Ohki et al. |
| 5,891,753 A | 4/1999 | Akram |
| 5,892,271 A | 4/1999 | Takeda et al. |
| 5,898,224 A | 4/1999 | Akram |
| 5,905,303 A | 5/1999 | Kata |
| 5,973,389 A | 10/1999 | Culnane et al. |
| 5,973,404 A | 10/1999 | Akram et al. |
| 5,977,640 A | 11/1999 | Bertin et al. |
| 5,982,030 A | 11/1999 | MacIntrye |
| 5,984,691 A | 11/1999 | Brodsky et al. |
| 5,986,460 A | 11/1999 | Kawakami |
| 5,990,545 A | 11/1999 | Schueller et al. |
| 5,991,161 A | 11/1999 | Samaras et al. |
| 6,005,776 A | 12/1999 | Holman et al. |
| 6,008,543 A | 12/1999 | Iwabuchi |
| 6,011,694 A | 1/2000 | Hirakawa |
| 6,013,948 A | 1/2000 | Akram et al. |
| 6,020,629 A | 2/2000 | Farnworth et al. |
| 6,022,761 A | 2/2000 | Grupen-Shemansky et al. |
| 6,024,584 A | 2/2000 | Lemke et al. |
| 6,027,346 A | 2/2000 | Sinsheimer et al. |
| 6,028,365 A | 2/2000 | Akram et al. |
| 6,034,427 A | 3/2000 | Lan et al. |
| 6,037,665 A | 3/2000 | Miyazaki |
| 6,039,889 A | 3/2000 | Zhang et al. |
| 6,040,630 A | 3/2000 | Panchou et al. |
| 6,048,755 A | 4/2000 | Jiang et al. |
| 6,050,832 A | 4/2000 | Lee et al. |
| 6,057,178 A | 5/2000 | Galuschki et al. |
| 6,060,782 A | 5/2000 | Ohsono et al. |
| 6,064,114 A | 5/2000 | Higgins, III |
| 6,072,233 A | 6/2000 | Corisis et al. |
| 6,074,897 A | 6/2000 | Degani et al. |
| 6,075,710 A | 6/2000 | Lau |
| 6,079,991 A | 6/2000 | Lemke et al. |
| 6,093,035 A | 7/2000 | Lemke et al. |
| 6,116,921 A | 9/2000 | Scholz et al. |
| 6,124,631 A | 9/2000 | Cardot et al. |
| 6,127,736 A | 10/2000 | Akram |
| 6,133,072 A | 10/2000 | Fjelstad |
| 6,133,637 A | 10/2000 | Hikita et al. |
| 6,137,062 A | 10/2000 | Zimmerman |
| 6,137,164 A | 10/2000 | Yew et al. |
| 6,137,183 A | 10/2000 | Sako |
| 6,157,541 A | 12/2000 | Hacke |
| 6,165,885 A | 12/2000 | Gaynes et al. |
| 6,172,422 B1 | 1/2001 | Chigawa et al. |
| 6,177,723 B1 | 1/2001 | Eng et al. |
| 6,179,598 B1 | 1/2001 | Brand |
| 6,180,881 B1 | 1/2001 | Isaak |
| 6,191,487 B1 | 2/2001 | Rodenbeck et al. |
| 6,208,521 B1 | 3/2001 | Nakatsuka |
| 6,208,525 B1 | 3/2001 | Imasu et al. |
| 6,212,768 B1 | 4/2001 | Murakami |
| 6,214,156 B1 | 4/2001 | Takano et al. |
| 6,217,343 B1 | 4/2001 | Okuno |
| 6,218,202 B1 | 4/2001 | Yew et al. |
| 6,219,911 B1 | 4/2001 | Estes et al. |
| 6,221,763 B1 | 4/2001 | Gilton et al. |
| 6,222,265 B1 | 4/2001 | Akram et al. |
| 6,225,688 B1 | 5/2001 | Kim et al. |
| 6,229,711 B1 | 5/2001 | Yoneda |
| 6,232,666 B1 | 5/2001 | Corisis et al. |
| 6,242,932 B1 | 6/2001 | Hembree |
| 6,262,895 B1 | 7/2001 | Forthun |
| 6,265,775 B1 | 7/2001 | Seyyedy |
| 6,271,469 B1 | 8/2001 | Ma et al. |
| 6,281,046 B1 | 8/2001 | Lam |
| 6,285,081 B1 | 9/2001 | Jackson |
| 6,291,265 B1 | 9/2001 | Mess |
| 6,291,775 B1 | 9/2001 | Saitoh |
| 6,291,884 B1 | 9/2001 | Glenn et al. |
| 6,294,455 B1 | 9/2001 | Ahn |
| 6,295,730 B1 | 10/2001 | Akram |
| 6,300,679 B1 | 10/2001 | Mukerji et al. |
| 6,310,288 B1 | 10/2001 | Moden |
| 6,323,060 B1 | 11/2001 | Isaak |
| 6,338,985 B1 | 1/2002 | Greenwood |
| 6,376,769 B1 | 4/2002 | Chung |
| 6,404,648 B1 | 6/2002 | Slupe et al. |
| 6,407,450 B1 | 6/2002 | Verma et al. |
| 6,413,102 B2 | 7/2002 | Jiang et al. |
| 6,429,516 B1 | 8/2002 | Tsunoi |
| 6,432,737 B1 | 8/2002 | Webster |
| 6,449,840 B1 * | 9/2002 | Le et al. ....................... 29/852 |
| 6,452,807 B1 | 9/2002 | Barrett |
| 6,468,831 B2 | 10/2002 | Leong et al. |
| 6,482,676 B2 | 11/2002 | Tsunoi et al. |
| 6,489,676 B2 | 12/2002 | Taniguchi et al. |
| 6,489,687 B1 | 12/2002 | Hashimoto |
| 6,492,737 B1 | 12/2002 | Imasu et al. |
| 6,515,324 B2 | 2/2003 | Shibuya et al. |
| 6,518,677 B1 | 2/2003 | Capote et al. |
| 6,534,853 B2 | 3/2003 | Liu et al. |
| 6,552,910 B1 | 4/2003 | Moon et al. |
| 6,563,223 B2 | 5/2003 | Freeman |
| 6,583,058 B1 * | 6/2003 | Rajendran et al. .......... 438/675 |
| 6,586,830 B2 | 7/2003 | Saito |

| | | |
|---|---|---|
| 6,600,222 B1 | 7/2003 | Levardo |
| 6,610,559 B2 | 8/2003 | Wang et al. |
| 6,624,060 B2* | 9/2003 | Chen et al. .................. 438/613 |
| 6,634,100 B2 | 10/2003 | Akram et al. |
| 6,714,418 B2 | 3/2004 | Frankowsky et al. |
| 6,730,855 B2 | 5/2004 | Bando |
| 6,744,122 B1 | 6/2004 | Hashimoto |
| 6,756,251 B2 | 6/2004 | Lee |
| 6,791,195 B2 | 9/2004 | Urushima |
| 6,841,862 B2* | 1/2005 | Kikuchi et al. ............. 257/680 |
| 2001/0048157 A1 | 12/2001 | Murtuza |
| 2001/0053563 A1 | 12/2001 | Kim et al. |
| 2002/0027080 A1* | 3/2002 | Yoshioka et al. ........... 205/123 |
| 2002/0045611 A1 | 4/2002 | Abrams et al. |
| 2002/0079594 A1 | 6/2002 | Sakurai |
| 2002/0127769 A1 | 9/2002 | Ma et al. |
| 2002/0142513 A1 | 10/2002 | Fee et al. |
| 2002/0167092 A1 | 11/2002 | Fee et al. |
| 2002/0185661 A1 | 12/2002 | Kawanobe et al. |
| 2003/0012930 A1 | 1/2003 | Brousseau, III |
| 2003/0042595 A1 | 3/2003 | Canella |
| 2003/0134450 A1 | 7/2003 | Lee |
| 2004/0026773 A1 | 2/2004 | Koon et al. |
| 2004/0212055 A1 | 10/2004 | Exposito et al. |
| 2004/0217454 A1 | 11/2004 | Brechignac et al. |

FOREIGN PATENT DOCUMENTS

| | | |
|---|---|---|
| EP | 684644 | 11/1995 |
| EP | 0997942 A2 | 5/2000 |
| EP | 1009027 | 6/2000 |
| JP | 04030456 | 2/1992 |
| JP | 2002-028702/04 | 9/1999 |
| JP | 2000-183082 | 6/2000 |
| JP | 02000230964 | 8/2000 |
| JP | 2001077294 | 3/2001 |
| KR | 2001054744 | 7/2001 |
| WO | WO 99/65282 | 12/1999 |

OTHER PUBLICATIONS

Australian Search Report dated Aug. 16, 2004 (4 pages).

Australian Search Report dated Nov. 8, 2004 (5 pages).

Al-Sarawi et al., "A review of 3-D packaging technology," *Components, Packaging, and Manufacturing Technology, Part B: IEEE Transactions on Advanced Packaging*, vol. 21, Issue 1, Feb. 1998, pp. 2-14.

Andros et al., "TBGA Package Technology," *Components, Packaging, and Manufacturing Technology, Part B: IEEE Transactions on Advanced Packaging*, vol. 17, Issue 4, Nov. 1994, pp. 564-568.

Clot et al., "Flip-Chip on Flex for 3D Packaging," 1999. 24th *IEEE/CPMT*, Oct. 18-19, 1999, pp. 36-41.

Ferrando et al., "Industrial approach of a flip-chip method using the stud-bumps with a non-conductive paste," *Adhesive Joining and Coating Technology in Electronics Manufacturing, 2000. Proceedings, 4th International Conference on*, Jun. 18-21, 2000, pp. 205-211.

Gallagher et al., "A Fully Additive, Polymeric Process for the Fabrication and Assembly of Substrate and Component Level Packaging," *The First IEEE International Symposium on Polymeric Electronics Packaging*, Oct. 26-30, 1997, pp. 56-63.

Geissinger et al., "Tape Based CSP Package Supports Fine Pitch Wirebonding," *Electronics Manufacturing Technology Symposium*, 2002, IEMT 2002, 27th Annual IEEE/SEMI International, Jul. 17-18, 2002, pp. 41-452.

Hatanaka, H., "Packaging processes using flip chip bonder and future directions of technology development," *Electronics Packaging Technology Conference*, 2002. 4th, Dec. 10-12, 2002, pp. 434-439.

Haug et al., "Low-Cost Direct Chip Attach: Comparison of SMD Compatible FC Soldering with Anisotropically Conductive Adhesive FC Bonding," *IEEE Transactions on Electronics Packaging Manufacturing*, vol. 23, No. 1, Jan. 2000, pp. 12-18.

Kloeser et al., "Fine Pitch Stencil Printing of Sn/Pb and Lead Free Solders for Flip Chip Technology," *IEEE Transactions of CPMT—Part C*, vol. 21, No. 1, 1998, pp. 41-49.

Lee et al., "Enhancement of Moisture Sensitivity Performance of a FBGA," *Proceedings of International Symposium on Electronic Materials & Packaging*, 2000, pp. 470-475.

Li et al., "Stencil Printing Process Development for Flip Chip Interconnect," *IEEE Transactions Part C: Electronics Packaging Manufacturing*, vol. 23, Issue 3, (Jul. 2000), pp. 165-170.

Lyons et al., "A New Approach to Using Anisotropically Conductive Adhesives for Flip-Chip Assembly, Part A," *IEEE Transactions on Components, Packaging, and Manufacturing Technology*, vol. 19, Issue 1, Mar. 1996, pp. 5-11.

Teo et al., "Enhancing Moisture Resistance of PBGA," *Electronic Components and Technology Conference*, 1988. 48th IEEE, May 25-28, 1998, pp. 930-935.

Teutsch et al, "Wafer Level CSP using Low Cost Electroless Redistribution Layer," *Electronic Components and Technology Conference*, 2000. 2000 Proceedings. 50th, May 21-24, 2000, pp. 107-113.

"The 2003 International Technology Roadmap for Semiconductor: Assembly and Packaging."

Tsui et al., "Pad redistribution technology for flip chip applications," *Electronic Components and Technology Conference*, 1998. 48th IEEE, May 25-28, 1998, pp. 1098-1102.

Xiao et al., "Reliability study and failure analysis of fine pitch solder-bumped flip chip on low-cost flexible substrate without using stiffener," IEEE, 2002. Proceedings 52nd, May 28-31, 2002, pp. 112-118.

U.S. Patent Application entitled Microelectronic Devices and Methods of Manufacture, filed Aug. 30, 2001, U.S. Appl. No. 09/944,465.

Isaak, H. et al., "Development of Flex Stackable Carriers" IEEE Electronic Components and Technology Conference, 2000 Proceedings 50th, May 21, 2000-May 24, 2000, Las Vegas, NV, USA, pp. 378-384, IEEE Catalog No. 00CH37070.

Australian Patent Office, Search Report, May 30, 2003, 4 pages.

Xiao et al., "Reliability Study and Failure Analysis of Fine Pitch Solder-Bumped Flip Chip on Low-Cost Flexible Substrate without Using Stiffener," IEEE, 2002. Proceedings 52nd, May 28-31, 2002, pp. 112-118.

Xiao et al., "Reliability Study and Failure Analysis of Fine Pitch Solder Bumped Flip Chip on Low-Cost Printed Circuit Board Substrate," IEEE, 2001, Electronic Components and Technology Conference, 8 pages.

* cited by examiner

DOUBLE BUMPING OF FLEXIBLE SUBSTRATE FOR FIRST AND SECOND LEVEL INTERCONNECTS

CROSS-REFERENCE TO RELATED APPLICATION

This application is a divisional of application Ser. No. 10/225,085, filed Aug. 20, 2002, pending.

BACKGROUND OF THE INVENTION

1. Field of the Invention

The present invention relates generally to methods and apparatus of preparing and forming interconnections on an interposer substrate for assembling one or more semiconductor dice thereto and, particularly, providing interconnections on the interposer substrate for a first level interconnect and a second level interconnect.

2. State of the Art

Interconnection and packaging-related issues are among the factors that determine not only the number of circuits that can be integrated on a chip but also the performance of the chip. These issues have gained importance as advances in chip design have led to reduced sizes of transistors and enhanced chip complexity. The industry has come to realize that merely having a fast chip will not necessarily result in a fast system; the fast chip must also be supported by equally fast and reliable connections. Essentially, the connections, in conjunction with the packaging, supply the chip with signals and power and redistribute the tightly packed terminals of the chip to the terminals of a carrier substrate and then to a circuit board.

One example of such an integrated circuit device is known as a "flip-chip." Flip-chip attachment generally includes electrically and mechanically attaching a semiconductor die by its active surface to an interposer substrate or other carrier substrate using an array of discrete conductive elements formed on the semiconductor die. The discrete conductive elements are formed and bonded to bond pads on the active surface of the semiconductor die, usually during fabrication of the semiconductor die along with a large number of others in wafer form, after which the wafer is singulated into the individual semiconductor die.

The discrete conductive elements usually are configured as minute conductive bumps or balls, but also may include studs, pillars or columns of various configurations. The conductive bumps or discrete conductive elements are typically, in the case of solder balls, attached to the bond pads by first forming an under bump metal (UBM) compatible with the material of the bond pads, as well as the solder balls. The UBM for solder balls to be placed on aluminum bond pads commonly includes metal layers, bottom to top, of Cr, Cu and Au. The UBM may be formed by sputtering thin films over the aluminum bond pad through a patterning and etching process. The UBM may also be formed by an electroplating process of Cu and/or Ni with a thin Au overlay. A preformed solder ball (of, for example, 60% Sn and 40% Pb) may then be provided on the UBM and heated to a predetermined reflow temperature so as to bond the solder balls to the UBM structures on the wafer. Alternatively, a solder paste may be disposed on the UBM and then heated to liquify and form a solder ball.

Each discrete conductive element is placed corresponding to mutually aligned locations of bond pads (or other I/O locations) on the semiconductor die and terminals on the carrier substrate when the two components are superimposed. The semiconductor die is thus electrically and mechanically connected to the carrier substrate by, for example, reflowing conductive bumps of solder or curing conductive or conductor-filled epoxy bumps. A dielectric underfill may then be disposed between the die and the carrier substrate for environmental protection and to enhance the mechanical attachment of the die to the carrier substrate. For example, U.S. Pat. No. 5,710,071 to Beddingfield et al. discloses a fairly typical flip-chip attachment of a bumped semiconductor die to a carrier substrate and a method of underfilling a gap between the semiconductor die and substrate.

Flip-chip type assemblies having a bumped semiconductor die employing a carrier substrate, such as the carrier substrate disclosed in the Beddingfield et al. reference, may be undesirably thick due to the combined height of the bumped semiconductor die and carrier substrate. Ongoing goals of the computer industry include higher performance, lower cost, increased miniaturization of components, and greater packaging density of integrated circuits in, for example, a flip-chip type assembly. In an effort to meet goals such as increased miniaturization by limiting the height of a flip-chip type assembly, thin flexible interposer substrates have been introduced in the industry.

U.S. Pat. No. 5,386,341 to Olson et al. discloses such a thin flexible substrate utilized as an interposer substrate between a bumped semiconductor die and a circuit board. However, thin flexible substrates, such as that disclosed in the Olson et al. reference, require that bumps formed on the semiconductor dice be formed precisely to predetermined specifications with very low dimensional tolerances. Any failure in forming the bumps and interconnections on the semiconductor dice precisely so that the semiconductor dice align with corresponding terminals on an interposer substrate typically results in unusable semiconductor dice. Such unusable semiconductor dice may be scrapped, which is extremely costly, as a result of bad interconnections. These reliability issues are only compounded with the increased miniaturization of the semiconductor components. Furthermore, the method of forming the UBM structures and conductive bumps or solder balls on each of the bond pads on the wafer is consumptive of time, process and materials and, thus, costly.

Therefore, it would be advantageous to limit the time required for wafer bumping including the respective formation and attachment of the UBM structure and solder balls on the wafer. It would also be advantageous to prevent the loss of semiconductor dice due to failed interconnections on the semiconductor dice.

BRIEF SUMMARY OF THE INVENTION

The present invention relates to methods and apparatus for improving the yield and reducing the cost of fabricating a flip-chip type semiconductor assembly. The present invention is directed to forming an interposer substrate with interconnections formed on both a first surface and a second surface to provide a respective first level interconnect and a second level interconnect. The interposer substrate may include first and second sets of conductive bumps respectively formed on the first surface and second surface thereof. Both sets of conductive bumps may be formed simultaneously by an electrolytic or electroless process. The first set of conductive bumps may be configured to correspond with bond pad locations on at least one bumpless semiconductor die for the first level interconnect and the second set of conductive bumps may be configured to correspond with a pattern of interconnections on a circuit board or another semiconductor assembly for the second level interconnect. With this arrangement, the present invention provides structure for effecting interconnections on the interposer substrate for both a first level interconnection and second level interconnection, thereby eliminating the need for wafer bumping and the costs and reliability issues associated therewith. Furthermore, transferring such costs and reliability issues from fabrication of semiconductor dice on a wafer to fabrication of the far less expensive interposer substrate greatly reduces the cost of any defective parts that must be scrapped.

In one aspect of the present invention, the interposer substrate includes through holes extending between the first surface and the second surface thereof. Conductive lines may be formed over the first surface to extend from the through holes to remote locations on the first surface that correspond with locations of the bond pads of a bare semiconductor die. A plating process may then be conducted to form a first set of conductive bumps at such alternate locations. The plating process may also be used to simultaneously form a second set of conductive bumps in the through holes on the second surface of the interposer substrate for the second level interconnection to, for example, a circuit board. Alternatively, the second set of conductive bumps may also include a conductive paste disposed in the through holes, wherein conductive balls, such as solder balls, may be provided in the conductive paste on the second surface of the interposer substrate.

According to the present invention, the plating process for simultaneously forming the first and second sets of conductive bumps on the respective first surface and second surface may be accomplished chemically in an electroless process or electrochemically in an electrolytic process. The conductive materials that may be utilized in forming the conductive bumps may include at least one of copper, nickel, chromium, zinc, brass, cadmium, silver, tin and gold.

In another aspect of the present invention, a dielectric filler material may be disposed between the at least one bumpless semiconductor die and the interposer substrate. The filler material may be provided by dispensing a flowable dielectric filler material to fill a gap between the bumpless semiconductor die attached to the interposer substrate. Alternatively, the dielectric filler material may be a nonflowable filler material, in which case the nonflowable filler material may comprise a dielectric filler film. The dielectric filler film is adhesively attached to either the semiconductor die or interposer substrate prior to attaching the bumpless semiconductor die to the interposer substrate.

In another aspect of the present invention, the semiconductor device assembly of the present invention is mounted to a circuit board in an electronic system, such as a computer system. In the electronic system, the circuit board is electrically connected to a processor device, which communicates with an input device and an output device.

Other features and advantages of the present invention will become apparent to those of skill in the art through a consideration of the ensuing description, the accompanying drawings and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be ascertained from the following description of the invention when read in conjunction with the accompanying drawings, wherein:

DETAILED DESCRIPTION OF THE INVENTION

Figure 1:
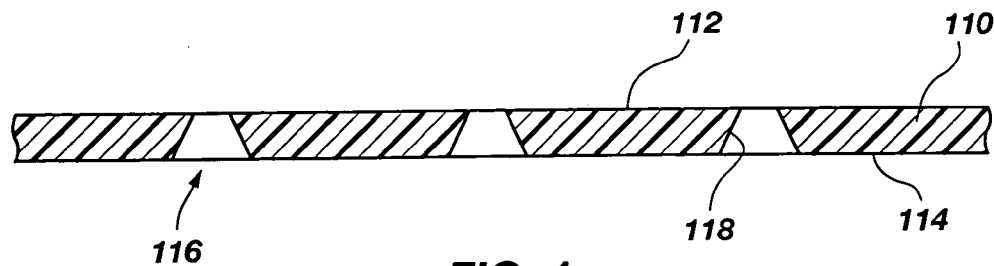
FIG. 1 illustrates a simplified cross-sectional view of an interposer substrate, depicting the interposer substrate having through holes formed therein, according to the present invention.

Embodiments of the present invention will be hereinafter described with reference to the accompanying drawings. It would be understood that these illustrations are not to be taken as actual views of any specific apparatus or method of the present invention, but are merely exemplary, idealized representations employed to more clearly and fully depict the present invention than might otherwise be possible. Additionally, elements and features common between the drawing figures retain the same or similar numerical designation.

Figure 2:
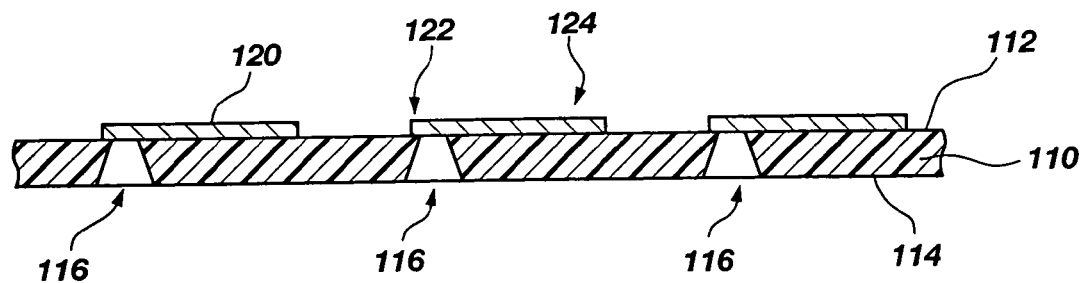
FIG. 2 illustrates a simplified cross-sectional view of the interposer substrate, depicting conductive lines formed on the interposer substrate, according to the present invention.
Figure 3:
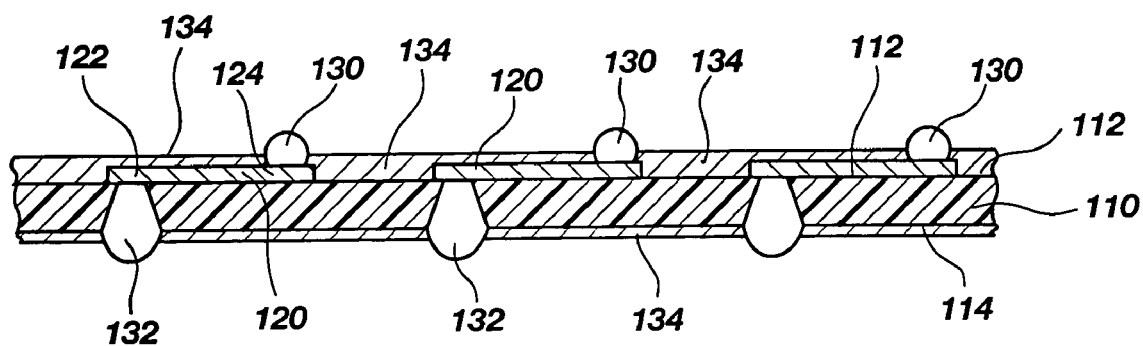
FIG. 3 illustrates a simplified cross-sectional view of the interposer substrate, depicting the interposer substrate having bumps and a protective layer formed thereon, according to the present invention.

FIGS. 1-3 illustrate a process that may be used for fabricating an interposer substrate having a first and second level interconnects formed thereon. Referring first to FIG. 1, an interposer substrate 110 including a first surface 112 and a second surface 114 is depicted. Interposer substrate 110 may comprise a flexible material such as, for example, a polyimide or other polymeric material. Interposer substrate 110 is utilized to provide an electrical interconnect between one or more semiconductor dice and other electronic components located external to interposer substrate 110.

The interposer substrate 110 may include through holes 116 extending between the first surface 112 and second surface 114 thereof for electrically interconnecting a semiconductor chip to external components, as explained hereinafter. The through holes 116 may include tapered, frusto-conical walls 118 extending between the first surface 112 and second surface 114, which, as shown, taper inward from the second surface 114 of the interposer substrate 110. The tapered through holes 116 may be formed using any suitable method known in the art, such as, for example, a wet chemical etch or laser ablation.

Through holes 116 formed using a wet etch may result in a tapered wall angle of approximately 45 degrees from the vertical, which angle may vary depending on the type of reactive chemical etchant utilized for removing the interposer substrate material. From a production standpoint, such wet etching may be preferred since many interposer substrates may be processed at a relatively minimal process time. On the other hand, while laser ablation techniques may be more time consuming, they provide greater versatility in forming a broad range of tapered angles, which may be advantageous depending on the requirements of the designer of the interposer substrate.

Figure 1A:
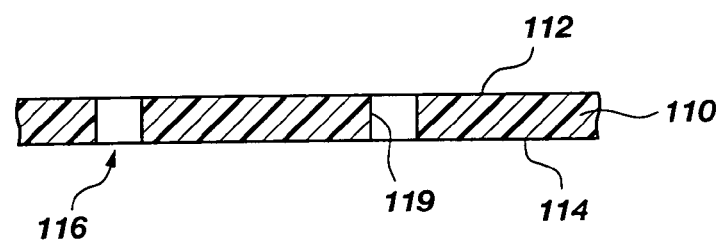
FIG. 1A illustrates a simplified cross-sectional view of an interposer substrate, depicting an alternative through hole formed in the interposer substrate, according to the present invention.

Alternatively, as illustrated in FIG. 1A, interposer substrate 110 may include through holes 116 therein formed using a mechanical punch, as known in the art. The punch may be configured to form any shape of through hole, such as circular, square and the like, wherein the through holes 116 are defined by parallel punched walls 119. The punched walls 119 may substantially extend orthogonal to the first surface 112 and the second surface 114 of the interposer substrate 110.

FIG. 2 illustrates the interposer substrate 110 with conductive lines 120 formed on a first surface 112 thereof. Preferably, the conductive lines 120 are a copper or a copper alloy material. However, conductive lines 120 may include any suitable electrically conductive material such as, for example, gold, aluminum, nickel and alloys thereof.

The conductive lines 120 may be formed by any known method in the art, such as deposition and etching processes, screen printing or a tape carrying preformed conductive traces, etc. By way of example, the conductive lines 120 may be formed by depositing a layer of conductive material over the first surface 112 of the interposer substrate 110. Such depositing of conductive material may be accomplished by physical vapor deposition, chemical vapor deposition, sputtering, screen printing, vacuum deposition, or other any known method of depositing a thin conductive material. The layer of conductive material may then be selectively masked and patterned using a positive or negative photoresist as known in the art followed by etching using a wet or dry etch to form the conductive lines 120.

The conductive lines 120 may extend over the first surface 112 so that a first portion 122 extends over a through hole 116 and a second portion 124 extends to a predetermined position remote from the associated through hole 116 on the first surface 112 of the interposer substrate 110. Such a predetermined remote position is selected to proximately correspond with a first level interconnect pattern, such as a bond pad pattern of a semiconductor die. In this manner, multiple conductive lines 120 may be formed so that each conductive line 120 may extend from and/or over a through hole 116 to a predetermined remote position on the first surface 112 of the interposer substrate 110.

FIG. 3 illustrates the interposer substrate 110 with conductive bumps 130 formed on the first surface 112 and conductive bumps 132 formed on the second surface 114 of the interposer substrate 110. Prior to forming the conductive bumps 130, the conductive lines 120 may have a protective layer 134 applied thereover. The protective layer 134 may comprise any electrical and environmental barrier formed of any known material, such as a solder resist. The protective layer 134 may be provided in the form of an epoxy-based paste or in dry film form, which serves as a surface insulator and mask for those areas where electrical interconnection and plating is not wanted. The protective layer 134 may be blanket deposited and selectively etched to form apertures exposing the second portions 124 of the conductive lines 120. By this arrangement, the second portions 124 of the conductive lines 120 may be exposed for facilitating the formation of the conductive bumps 130 thereon. It is also contemplated that a protective layer 134 comprising, for example, a solder resist, may be applied over second surface 114. Use of, for example, a dry film protective layer 134 not only protects conductive lines 120 but, as best shown in FIG. 3, precise location of the apertures and sizing and configuration of the apertures formed in a protective layer 134 facilitates formation of conductive bumps 130 and 132 and enables a finer design rule as to bump size and pitch.

The conductive bumps 130 may be formed on the exposed second portion 124 of the conductive lines 120 by an electrolytic plating process or an electroless plating process. Such conductive bumps 130 may be sized and configured in the predetermined locations of the second portion 124 of the conductive lines 120 to correspond with bond pads of a semiconductor die (not shown). Alternatively, the conductive bumps 130 may be formed in recesses 136 50 that the conductive bumps 130 abut with an end 126 of the second portion 124 while also being disposed in the recesses 136 (see FIG. 3A). Such a recess for the conductive bumps to be disposed in may result in a reduction of height in the conductive bumps 130 with respect to the interposer substrate 110 compared to providing the conductive bumps 130 directly on the conductive lines 120. In either case, the conductive bumps 130 are configured to slightly protrude from the first surface 112 of the interposer substrate 110 as a first level interconnect and configured to correspond to and interconnect with a bond pad outline on a semiconductor die.

Conductive bumps 132 are formed in the through holes 116 and are sized and configured to protrude slightly from the second surface 114 of the interposer substrate 110. The conductive bumps 132 may be configured to electrically and mechanically interconnect with the first portions 122 of the conductive lines 120 that extend to and/or over the through holes 116 on the first surface 112 of the interposer substrate 110. The conductive elements 132 are configured in an array as a second level interconnect and configured to correspond to and interconnect with a terminal pad pattern of a circuit board, other higher-level packaging or even another semiconductor substrate. It should also be noted that conductive lines 120, as shown in broken lines in FIG. 3A, may be formed on second surface 114 of interposer substrate 110 and contacted by conductive bumps 132. Recesses 136 may be extended, also as shown in broken lines in FIG. 3A, for contact of conductive bumps 130 formed therein with the conductive lines 120 on second surface 114. Thus it will be apparent that conductive lines 120 may be used on either the first surface 112, the second surface 114, or both as desired or required, in accordance with the present invention.

According to the present invention, both the conductive bumps 130 and the conductive bumps 132 maybe formed simultaneously by the above-referenced electrolytic plating or electroless plating processes. As is well known in the art, an electrolytic plating process is a metal deposition process in which an electrolyte, or a solution containing dissolved salts of the metal to be plated, transfers cations from an anode into the electrolyte and onto the exposed first portions 122 and second portions 124 of conductive lines 120 serving as a cathode by means of a direct electrical current applied to the electrolyte from the anode to the cathodes. The metal may be caused to deposit and build up to a predetermined size to form the conductive bumps 130 and conductive bumps 132 on the exposed second portions 124 of the conductive lines 120 and the exposed first portions 122 of the conductive lines 120 extending over the through hole 116, respectively, in the interposer substrate 110.

Likewise, the conductive bumps 130 and conductive bumps 132 may be formed simultaneously on the interposer substrate 110 in an electroless plating process. As is well known in the art, an electroless plating process comprises the deposition of metallic particles from a chemical solution, usually at elevated temperatures, without an electrical current flowing as is used in the electrolytic plating process. The electroless plating process is highly controlled in producing a uniform thickness of up to several mils; however, such electroless plating process is more time-consuming than the electrolytic process. For purposes of the present invention, either the electrolytic plating or the electroless plating process may be utilized in forming the conductive bumps 130 and conductive bumps 132.

Thus, the electrolytic plating process employs an electrochemical plating process for depositing a conductive material. Likewise, the electroless plating process employs a chemical plating process. The conductive materials utilized in the electrolytic plating and electroless plating processes may include a base layer of tin or nickel followed by a gold layer, or plated layers of tin/silver/copper and alloys thereof. Other conductive materials may be utilized in the plating process in various combinations of plated layers as known in the art such as, for example, copper, nickel, chromium, zinc, brass, cadmium, silver, lead, tin and gold and alloys thereof.

It is noted that conductive bumps 130 may be formed or coated with a surface finish or coating comprising a compliant, deformable or compressible material to help relax coplanarity requirements for conductive bumps 130 and 132. If such a surface finish is employed, slight compression of a semiconductor die 140 (see FIG. 5) against conductive bumps 130 or compression of interposer substrate 110 against a carrier substrate such as a printed circuit board (not shown) will bring the outer ends or tips of conductive bumps 130, 132 of somewhat different heights into coplanarity at a common level without damage to the conductive bumps 130, 132 or to other elements of semiconductor die 140 or interposer substrate 110. Suitable surface finish materials for providing some relaxation of coplanarity issues include, without limitation, gold, a conductive or conductor-filled polymer, or PbSn solder. Of course, gold may be plated as part of the bump plating process, as may consecutive layers of tin and lead, while a polymer or a solder paste may be applied to the surfaces of conductive bumps 132 after formation thereof.

Figure 3A:
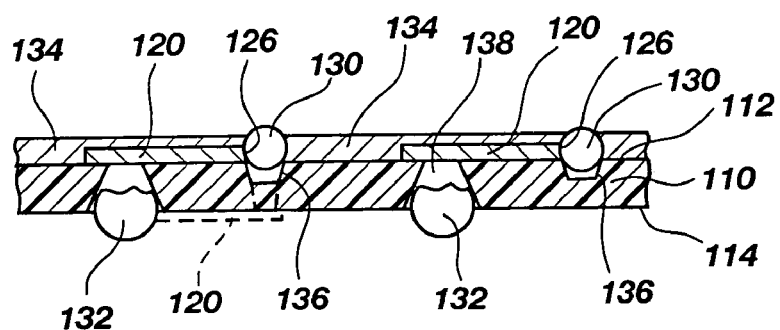
FIG. 3A illustrates a simplified cross-sectional view of the interposer substrate, depicting an alternative method of arranging the conductive lines and bumps formed on the interposer substrate, according to the present invention.

In an alternative embodiment also depicted in FIG. 3A, the electrolytic plating or electroless plating processes may be limited to forming the conductive bumps 130 in their entireties. In other words, the plating process may not fill the through holes 116 to sufficiently form the conductive bumps 132 in the time taken for entirely forming the conductive bumps 130. In this case, the through holes 116 may be filled with a conductive paste 138, such as a solder paste. Preformed conductive bumps 132 may then be disposed in the conductive paste 138 so that the conductive bumps 132 slightly protrude from the second surface 114 of the interposer substrate 110 as a second level interconnect to correspond to and interconnect with a terminal pad pattern of a circuit board, other carrier substrate, or another semiconductor assembly. The preformed conductive bumps 132 used in this alternative may comprise any conductive material, such as solder balls. Further, a conductive paste 138 may be used to fill through holes 116 without prior plating, if desired.

Figure 4:
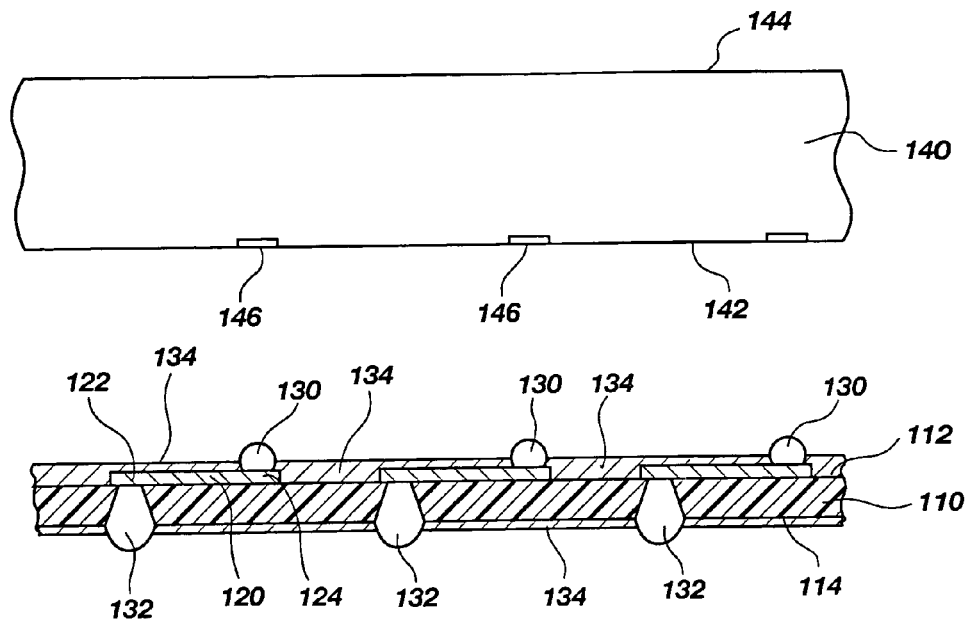
FIG. 4 illustrates a simplified cross-sectional view of a bumpless semiconductor die facing the bumped interposer substrate in an unattached position, according to the present invention.

Turning to FIG. 4, a partial cross-sectional view of the interposer substrate 110 of the present invention and a semiconductor die 140 in a mutually superimposed, but not yet assembled position, is illustrated. The interposer substrate 110 includes the conductive bumps 130 and conductive bumps 132 formed on and extending from the respective first surface 112 and second surface 114 thereof. The semiconductor die 140 includes an active surface 142 and a back surface 144 with an array of bond pads 146 on the active surface 142 thereof. The semiconductor dice 140 utilized in the present invention are bare, bumpless semiconductor dice and, more specifically, the active surfaces 142 of the semiconductor dice 140 do not include conductive bumps 130 formed on or bonded to the bond pads 146 thereof. As shown, individual semiconductor dice 140 may be assembled with individual interposer substrates 110.

In the unassembled position, the conductive bumps 130 on the interposer substrate 110 are positioned and aligned with the bond pads 146 on the semiconductor die 140 in preparation for a first level interconnect. Such positioning and aligning of the semiconductor die 140 to the conductive bumps 130 of the interposer substrate 110 may be accomplished with mechanically or optically referenced pick and place equipment, as is well known in the art.

Figure 5:
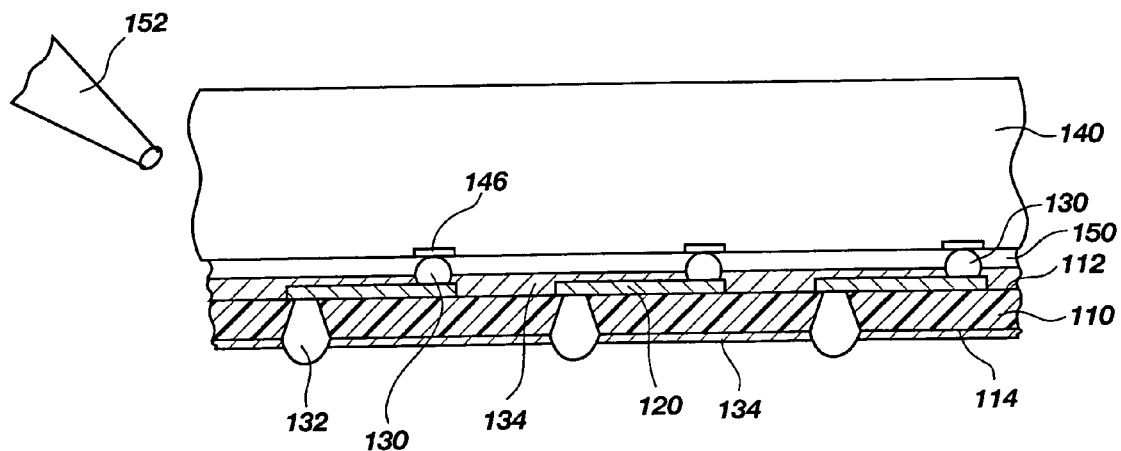
FIG. 5 illustrates a simplified cross-sectional view of the bumpless semiconductor die attached to the interposer substrate with filler material dispensed therebetween, according to the present invention.

FIG. 5 illustrates the semiconductor die 140 mounted to the interposer substrate 110 so that the bond pads 146 interconnect with the conductive bumps 130 formed on the interposer substrate 110. Such an interconnection forms a gap between the semiconductor die 140 and interposer substrate 110, wherein a dielectric flowable filler material 150 may be dispensed from dispenser head 152 to fill the gap. Prior to dispensing the dielectric filler material, the conductive bumps 130 and bond pads 146 may be bonded in a suitable process for the material or materials of conductive bumps 130. For example, if a plated bump with a thin gold coating is used for conductive bumps 130, thermosonic bonding may be used to interconnect conductive bumps 130 with bond pads 146. Heat-induced bump reflow may be used if conductive bumps are formed of a tin/lead, silver, or other solder material. Eutectic bonding may also be employed. The dielectric flowable filler material 150 may then be dispensed to fill the gap by any known method in the art such as, for example, capillary action or by positive pressure from dispenser head 152, with optional application of a negative pressure (vacuum) to the gap at a location opposite dispenser head 152.

Figure 6:
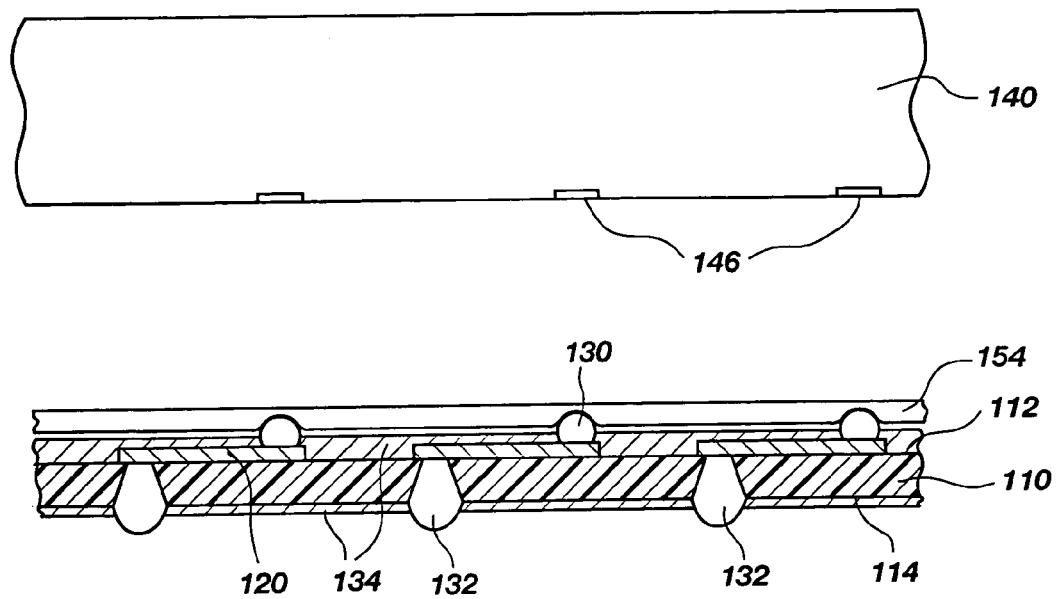
FIG. 6 illustrates a cross-sectional view of an alternative method of forming a filler material between a bumpless semiconductor die and an interposer substrate, depicting the bumpless semiconductor die facing the bumped interposer substrate in an unattached position with a nonflowable filler material disposed over the interposer substrate, according to the present invention.
Figure 7:
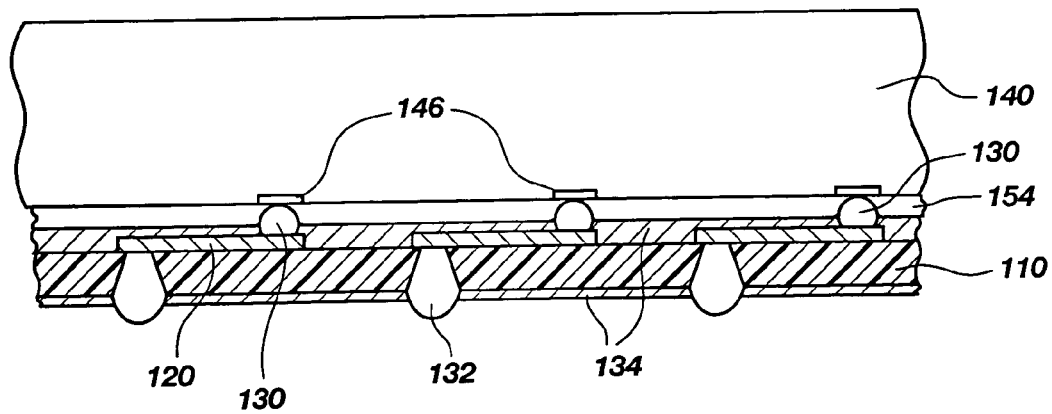
FIG. 7 illustrates a simplified cross-sectional view of the nonflowable filler material alternatively disposed between the bumpless semiconductor die attached to the interposer substrate, according to the present invention.

FIGS. 6 and 7 illustrate an alternative method of providing dielectric flowable filler material 150 between the semiconductor die 140 and the interposer substrate 110. Specifically, a nonconductive film (NCF) 154, which is nonflowable, is positioned on the interposer substrate 110 over first surface 112. The nonconductive film 154 may comprise an adhesive resin to facilitate attaching the nonconductive film 154 to the semiconductor die 140 or interposer substrate 110, after which the semiconductor die 140 may be mounted to the interposer substrate 110 in a manner similar to that described above. In the mounting process, the conductive bumps 130 are caused to pierce through the nonconductive film 154 by application of pressure and heat to the semiconductor die 140 and interposer substrate 110 to make contact with the bond pads 146 on the semiconductor die 140. The conductive bumps 130, if formed of solder, may then be heated to a higher temperature to undergo a reflow process for bonding to the bond pads 146 on the semiconductor die 140. The nonconductive film 154 utilized in this alternative method may include a suitable nonflowable filler material as known in the art, such as, for example, a UF 511 or UF 527 nonconductive film (NCF), each manufactured by Hitachi Chemical, Semiconductor Material Division, Japan.

As another alternative to a flowable filler material or an NCF, an anisotropic conductive film (ACF) wherein conductivity is restricted to the Z-axis perpendicular to the plane of the film may be employed. In such an instance, the conductive bumps 130 need not pierce the ACF, as the bond pads 146 and conductive bumps 130 will be placed in electrical contact through mutually laterally insulated conductive elements carried by the dielectric portion of the ACF and extending therethrough transverse to the plane of the film. A suitable ACF includes an FC 212K or FC 262B film from Hitachi Chemical, Semiconductor Material Division, Japan.

As another approach, an NCF may be provided over the active surface 142 of the semiconductor die 140 and other unsingulated dice at the wafer level. The wafer having the NCF disposed thereon may then be singulated into individual semiconductor dice, which then may be mounted face down on the interposer substrate 110 so that the conductive bumps 130 pierce the nonconductive film 154 and mechanically and electrically contact the bond pads 146 on the singlulated semiconductor dice 140, in a manner similar to that previously described. In a similar manner, an ACF may be applied at the wafer level.

Figure 8:
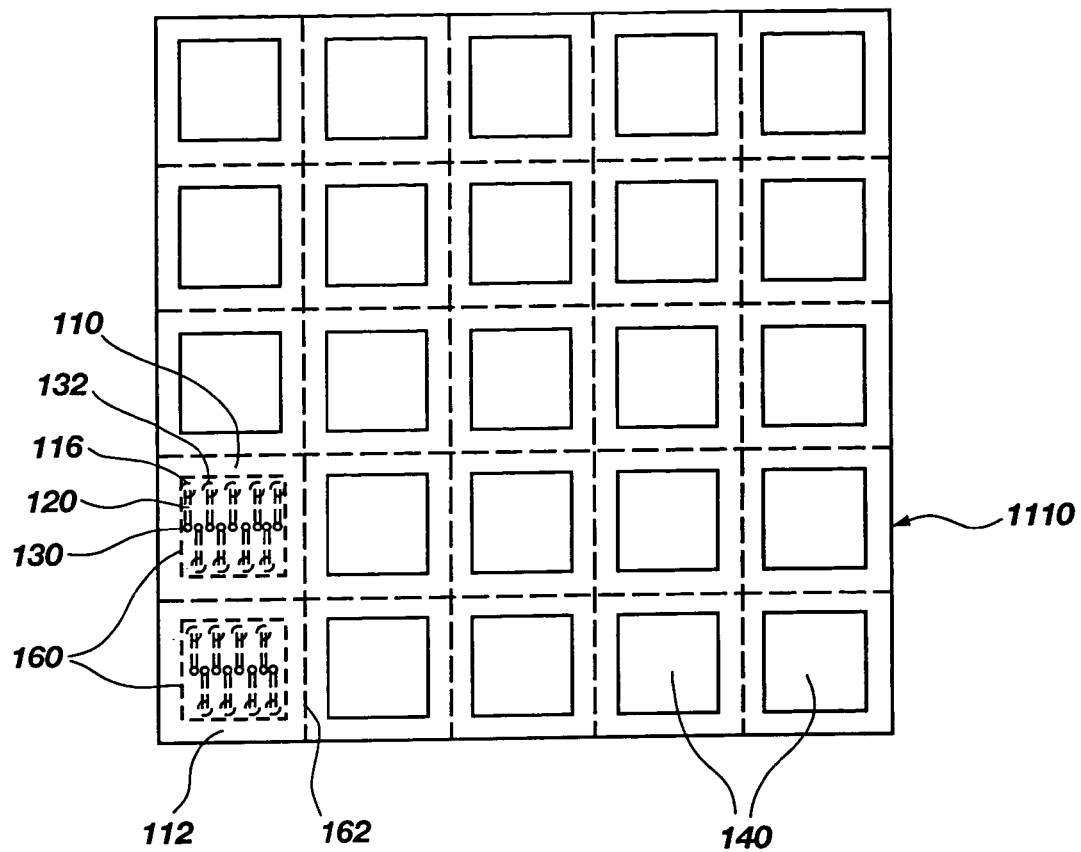
FIG. 8 illustrates a simplified top view of the interposer substrate having an array of die attach sites, depicting semiconductor dice attached to the die attach sites, according to the present invention.
Figure 9:
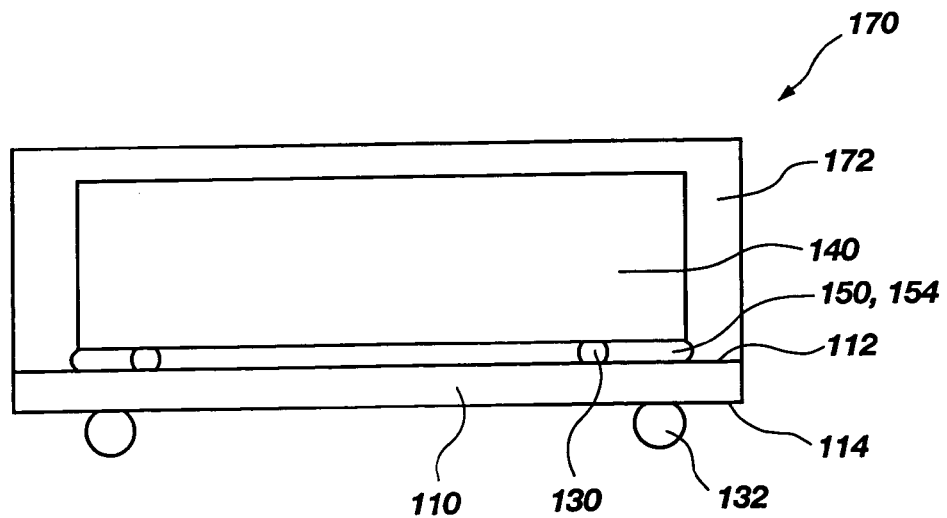
FIG. 9 illustrates a simplified cross-sectional view of a singulated semiconductor assembly having an encapsulation material formed thereover, according to the present invention.

Turning to FIG. 8, a top plan view of a multiple die site interposer substrate 1110 with multiple semiconductor dice 140 attached thereto is illustrated. The interposer substrate 1110 includes multiple die attach sites 160 in a matrix of columns and rows. Each die attach site 160 is configured to receive a semiconductor die 140 and includes the conductive bumps 130, conductive lines 120 and through holes 116 as previously set forth herein. Broken lines 162 are depicted to indicate where the interposer substrate 1110 may be separated into individual semiconductor assembly packages including individual interposer substrates 110 in a singulation process. The singulation process may be accomplished by sawing, by laser or electrodischarge machining or by any known separation or singulation process. Of course, as noted above, assembly of individual interposer substrates 110 with individual FIG. 9 illustrates an individual semiconductor assembly package 170 with an encapsulation material 172 formed thereon. Either prior to or subsequent to the singulation process, if a plurality of semiconductor dice 140 is connected to a multiple die site interposer substrate 1110, a dielectric encapsulation material 172 may be provided over each of the semiconductor dice 140 and its associated interposer substrate 110. The encapsulation material 172 may be provided by any known process, such as transfer molding, injection molding or pot molding. The encapsulation material 172 provides environmental protection to the semiconductor die 140. A dielectric flowable filler material 150 a nonconductive film 154 may also be employed, as desired, prior to encapsulation. It is specifically noted that semiconductor dice 140 is also contemplated as within the scope of the present invention. adequate clearance may be provided between die sites on an interposer substrate 1110 so that a blanket deposition of molding compound on the first surface 112 of interposer substrate 1110 may be employed to encapsulate the back sides and sides of all semiconductor dice attached thereto, followed by singulation of individual assemblies of semiconductor dice 140 with associated interposer substrates 110 along broken lines 162, as by sawing.

Thus, according to the present invention, interposer substrate 110 provides conductive bumps 130 formed on the first surface 112 thereof to provide a first level interconnect to bond pads 146 of a semiconductor die 140. Additionally, interposer substrate 110 provides conductive bumps 132 on the second surface 114 thereof to provide a second level interconnect to a carrier substrate or another semiconductor assembly. With this arrangement, the conventional step of wafer bumping is eliminated by providing the conductive bumps 130 on the interposer substrate 110. Therefore, it can be well appreciated by a person of ordinary skill in the art that if the conductive bumps 130 on an interposer substrate 110 are faulty, the cost of replacing the interposer substrate 110 is substantially less than the replacement of semiconductor dice having faulty bumps. In other words, semiconductor dice are more costly to replace than the interposer substrate 110. Furthermore, simultaneously forming the conductive bumps 132 and conductive bumps 130 on the interposer substrate 110 is cost effective and simplifies the assembly and fabrication process. Further, the present invention may be used to eliminate the use of solder balls, thereby providing a lead-free assembly.

Figure 10:
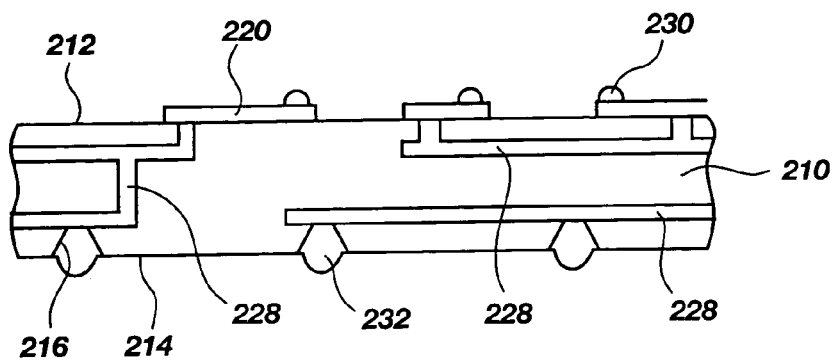
FIG. 10 illustrates a second embodiment of an interposer substrate depicting multiple levels of conductive lines in the interposer substrate, according to the present invention.

FIG. 10 illustrates a multilevel interposer substrate 210, according to a second embodiment of the present invention. In the second embodiment, the interposer substrate 210 includes a first surface 212 and a second surface 214 with recesses 216 formed in the second surface 214 thereof. Similar to the first embodiment, conductive lines 220 may be formed over the first surface 212. In addition, the interposer substrate 210 includes additional conductive line connections 228 at multiple levels within the interposer substrate 210, which interconnect to the conductive lines 220 on the first surface 212. Conductive bumps 230 may be formed on the conductive lines 220 on the first surface 212 by a plating process as set forth with respect to the first embodiment. Conductive bumps 232 may also be formed in the recesses 216 on the second surface 214 through the plating process, simultaneously with conductive bumps 230. In the alternative, after forming the conductive bumps 230, a conductive paste and conductive ball, such as a solder ball, may be disposed in the recesses 216 on the second surface 214 of the interposer substrate 210. A portion of recesses 216 may, of course, be plated during formation of conductive bumps 230.

Figure 11:
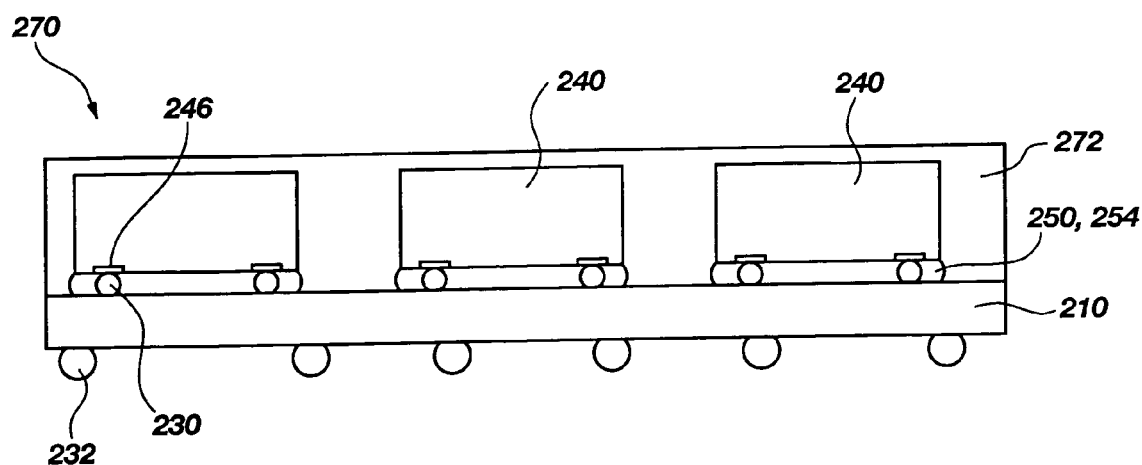
FIG. 11 illustrates a simplified side view of the interposer substrate with multiple levels attached to multiple semiconductor dice, according to the present invention.

FIG. 11 illustrates the interposer substrate 210 of the second embodiment with multiple semiconductor dice 240 mounted thereon by conductive bumps 230 on bond pads 246 to form a multi-die package 270. The semiconductor dice 240 may be underfilled with a dielectric filler material 250 or an NCF 254 and encapsulated with an encapsulation material 272 for environmental protection of the semiconductor dice 240, as previously set forth with respect to the first embodiment.

In the second embodiment, it can be well appreciated by one of ordinary skill in the art that the multiple levels of conductive lines 220 in the interposer substrate 210 may facilitate the assembly of multiple semiconductor dice 240 in a single package to form, for example, a multi-chip memory module or a multi-chip module including different types of semiconductor dice. Further, in a manner similar to the first embodiment, interposer substrate 210 includes the conductive bumps 230 and the conductive bumps 232 on the respective first surface 212 and second surface 214 to provide a respective first level interconnect and second level interconnect. It is also contemplated that fabrication of a multi-chip module using a single level interposer substrate 110 lies within the scope of the present invention and that the use of conductive lines 220 on both first and second surfaces 112,114 of an interposer substrate 110 may be particularly suitable for fabrication of such a multi-chip module.

Figure 12:
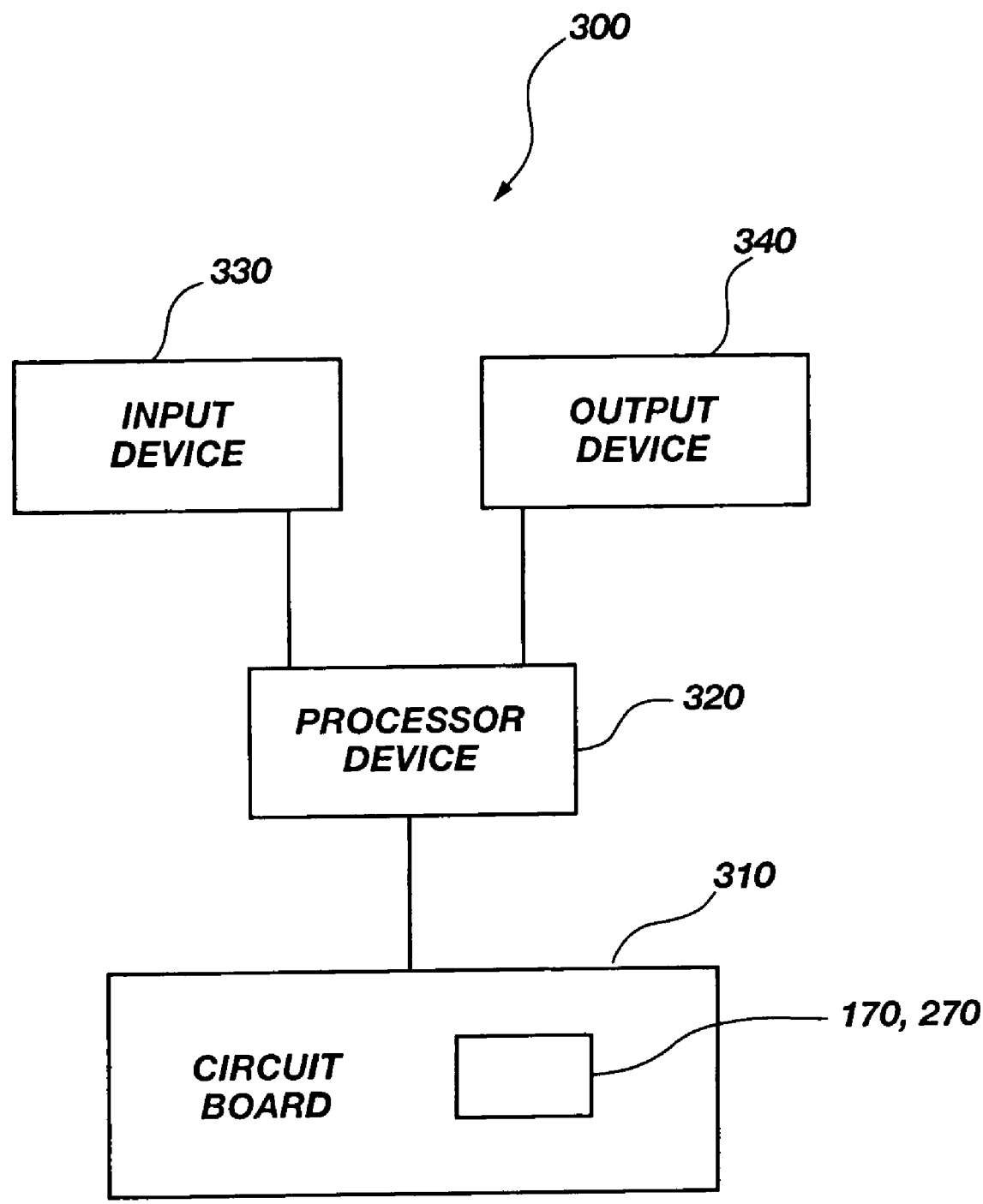
FIG. 12 illustrates a block diagram of the semiconductor assembly of the present invention interconnected to an electronic system, according to the present invention.

As illustrated in block diagram form in drawing FIG. 12, semiconductor assembly package 170 or 270 of the first and second embodiments or equivalents thereof may be respectively mounted to a circuit board 310 in an electronic system 300, such as a computer system. In the electronic system 300, the circuit board 310 may be connected to a processor device 320, which communicates with an input device 330 and an output device 340. The input device 330 may comprise a keyboard, mouse, joystick or any other type of electronic input device. The output device 340 may comprise a monitor, printer or storage device, such as a disk drive, or any other type of output device. The processor device 320 may be, but is not limited to, a microprocessor or a circuit card including hardware for processing instructions for the electronic system 300. Additional structure for the electronic system 300 is readily apparent to those of ordinary skill in the art.

Thus, it will be readily apparent to those of ordinary skill in the art that the present invention provides a simple, robust and economical interposer substrate and resulting packaged semiconductor die or dice. The bumping of an interposer substrate enables discarding of defective interposer substrates before attachment of a semiconductor die thereto and thus eliminates scrapping of assemblies due to defective interconnects. Further, the capability of forming bumps on both sides of an interposer substrate by simultaneous plating thereof speeds the interposer fabrication process and results in exact bump placement and precise bump dimensioning. The elimination of wafer bumping with solder balls by use of the present invention also speeds up the die fabrication process and eliminates defective bumping concerns with respect to the wafer. Furthermore, the present invention enables reduction in package thickness in comparison to solder-bumped assemblies and a further reduction in thickness through the use of bumps disposed in through holes or vias. Even if solder balls are employed for the second level interconnect, placement thereof is facilitated by the presence of the through holes or vias in which the solder balls may be disposed, as is a reduction in package thickness by recessing of a portion of the solder balls.

While the present invention has been disclosed in terms of certain currently preferred embodiments and alternatives thereof, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of forming an interposer substrate having a first level interconnect and a second level interconnect, the method comprising:

plating conductive bumps associated with a first major surface of a substantially planar interposer substrate body in a pattern for the first level interconnect and conductive bumps associated with a second major surface of the interposer substrate body in a pattern for the second level interconnect to at least one conductive line carried by the interposer substrate body, plating comprising plating the conductive bumps associated with at least one of the first major surface and the second major surface in at least some through holes of a plurality of through holes in the interposer substrate body;

providing conductive paste within at least one through hole of the plurality of through holes; and providing a conductive ball at least partially within the conductive paste, the conductive ball protruding from at least one of the first major surface and the second major surface of the interposer substrate body.

2. The method of claim 1, wherein plating conductive bumps comprises simultaneously plating the conductive bumps associated with the first major or surface and the conductive bumps associated with the second major surface.

3. The method of claim 1, further comprising forming a plurality of conductive lines over at least one of the first major surface and the second major surface of the interposer substrate body and extending between at least one through hole of plurality of through holes and at least one of the conductive bumps associated with at least one of the first major surface and the second major surface of the interposer substrate body.

4. The method of claim 1, wherein plating comprises at least one of an electrolytic plating process and an electroless plating process.

5. The method of claim 4, wherein plating further comprises plating the conductive bumps associated with the first major surface and the conductive bumps associated with the second major surface from conductive materials comprising at least one of copper, nickel, chromium, zinc, brass, cadmium, silver, tin and gold.

6. The method of claim 4, wherein plating further comprises forming at least some of the conductive bumps associated with the first major surface and the conductive bumps associated with the second major surface from multiple layers of conductive materials comprising at least one of copper, nickel, chromium, zinc, brass, cadmium, silver, tin, lead and gold.

7. The method of claim 2, wherein simultaneously plating comprises configuring the conductive bumps associated with the first major surface to protrude from the first major surface of the substantially planar interposer substrate body.

8. The method of claim 7, further comprising disposing a preformed conductive element on at least some of the conductive bumps plated in the at least some through holes of the plurality of through holes to cause each preformed conductive element to protrude from at least one of the first major surface and the second major surface of the substantially planar interposer substrate body.

9. The method according to claim 1, wherein plating further comprises forming at least one of the conductive bumps associated with one of the first major surface and the second major surface laterally abutting an end of the at least one conductive line.

10. A method of assembling a semiconductor device assembly, the method comprising:
   plating conductive bumps associated with a first major surface of an interposer substrate and conductive bumps associated with a second major surface of the interposer substrate to at least one conductive line carried by the interposer substrate, plating comprising plating the conductive bumps associated with at least one of the first major surface and the second major surface in at least some through holes of a plurality of through holes extending through the interposer substrate;
   providing conductive paste within at least one through hole of the plurality of through holes;
   providing a conductive ball at least partially within the conductive paste, the conductive ball protruding from at least one of the first major surface and the second major surface of the interposer substrate; and
   electrically connecting bond pads of at least one semiconductor die to the conductive bumps associated with at least one of the first major surface and the second major surface of the interposer substrate.

11. The method of claim 10, further comprising disposing a dielectric filler material between the at least one semiconductor die and the interposer substrate.

12. The method of claim 11, wherein disposing dielectric filler material comprises dispensing the dielectric filler material in flowable form to fill a gap between the at least one semiconductor die and the interposer substrate.

13. The method of claim 12, wherein disposing dielectric filler material comprises disposing a nonflowable dielectric filler material between the at least one semiconductor die and the interposer substrate.

14. The method of claim 13, further comprising selecting the nonflowable dielectric filler material from the group consisting of a nonconductive film and an anisotropically conductive film.

15. The method of claim 10, wherein electrically connecting bond pads of at least one semiconductor die to the conductive bumps comprises electrically connecting bond pads of each of a plurality of semiconductor dice to the conductive bumps associated with at least one of the first major surface and the second major surface of the interposer substrate.

16. The method of claim 10, further comprising encapsulating a back surface of the at least one semiconductor die with an encapsulation material.

17. A method of forming an interposer substrate having a first level interconnect and a second level interconnect, the method comprising:
   providing a substantially planar interposer substrate body having a first major surface and a second major surface;
   providing at least one conductive line carried by the interposer substrate body;
   forming at least one through hole through the interposer substrate body to the at least one conductive line;
   plating at least one conductive bump associated with the first major surface of the interposer substrate body to the at least one conductive line;
   providing conductive paste within the at least one through hole; and
   providing a conductive ball at least partially within the conductive paste, the conductive ball protruding from the second major surface of the interposer substrate body.

18. The method of claim 17, wherein plating at least one conductive bump comprises:
   plating a first conductive bump to a first surface of the at least one conductive line; and
   plating a second conductive bump to a second surface of the at least one conductive line;
   wherein providing conductive paste comprises providing the conductive paste within the at least one through hole over the second conductive bump.

19. The method of claim 18, wherein plating at least one conductive bump comprises simultaneously plating the first conductive bump and the second conductive bump.

* * * * *

UNITED STATES PATENT AND TRADEMARK OFFICE
CERTIFICATE OF CORRECTION

PATENT NO. : 7,320,933 B2  Page 1 of 1
APPLICATION NO. : 10/829778
DATED : January 22, 2008
INVENTOR(S) : Lee et al.

It is certified that error appears in the above-identified patent and that said Letters Patent is hereby corrected as shown below:

In column 12, line 34, in Claim 2, after "major" delete "or".

In column 12, line 40, in Claim 3, after "hole of" insert -- the --.

In column 13, line 38, in Claim 13, delete "claim 12," and insert -- claim 11, --, therefor.

Signed and Sealed this

Thirteenth Day of May, 2008

JON W. DUDAS
*Director of the United States Patent and Trademark Office*